United States Patent [19]

Reylek et al.

[11] Patent Number: 5,176,530

[45] Date of Patent: Jan. 5, 1993

[54] MINIATURE MULTIPLE CONDUCTOR ELECTRICAL CONNECTOR

[75] Inventors: Robert S. Reylek, Minneapolis; Kenneth C. Thompson, May Township, Washington County, both of Minn.

[73] Assignee: Minnesota and Mining and Manufacturing Company, St. Paul, Minn.

[21] Appl. No.: 765,132

[22] Filed: Sep. 25, 1991

Related U.S. Application Data

[63] Continuation of Ser. No. 510,573, Apr. 18, 1990, Pat. No. 5,071,363.

[51] Int. Cl.⁵ .............................................. H01R 13/28
[52] U.S. Cl. .................................... 439/290; 439/291
[58] Field of Search ............................ 439/284–293, 439/38, 39, 931, 296, 55, 59, 62; 24/575, 576, 578

[56] References Cited

U.S. PATENT DOCUMENTS

| | | | |
|---|---|---|---|
| 983,093 | 1/1911 | Svenson . | |
| 2,461,201 | 2/1949 | Ellis | 2/311 |
| 2,877,439 | 3/1959 | Avery | 439/285 |
| 3,086,899 | 4/1963 | Smith et al. | 154/45.9 |
| 3,108,924 | 10/1963 | Adie | 161/127 |
| 3,214,723 | 10/1965 | Dupre et al. | 339/99 |
| 3,577,105 | 5/1971 | Jones, Jr. | 333/95 |
| 3,638,164 | 1/1972 | Glance et al. | 439/284 |
| 3,736,627 | 6/1973 | Sosinski | 24/23 |
| 3,808,577 | 4/1974 | Methauser | 439/246 |
| 3,926,498 | 12/1975 | Hoppe, Jr. | 339/97 |
| 3,955,245 | 5/1976 | Ballin | 24/201 |
| 4,074,926 | 2/1978 | Broad | 339/60 |
| 4,139,727 | 2/1979 | Kuballa | 174/68.5 |
| 4,443,048 | 4/1984 | Moist, Jr. | 339/63 |
| 4,581,792 | 4/1986 | Spier | 24/575 |
| 4,749,371 | 6/1988 | Hirai et al. | 439/497 |
| 4,875,259 | 10/1989 | Appeldorn | 24/576 |

FOREIGN PATENT DOCUMENTS

| | | |
|---|---|---|
| 006257964 | 7/1984 | European Pat. Off. . |
| 005350945 | 4/1986 | European Pat. Off. . |
| 0223464 | 5/1987 | European Pat. Off. . |
| 2149593 | 6/1985 | United Kingdom . |

OTHER PUBLICATIONS

"Quick Disconnect Connectors", IBM Technical Disclosure Bulletin, J. L. Walsh vol. 3, No. 9, Feb. 1971 pp. 2533–2534.

*Primary Examiner*—David L. Pirlot
*Attorney, Agent, or Firm*—Gary L. Griswold; Walter N. Kirn; Mark W. Binder

[57] ABSTRACT

Two electronic components having fine pitch arrays of terminals can be disconnectably interconnected by a multiple electrical connector that includes a pair of intermeshable members. Each of those members has an electrically insulative body with a structured surface including a plurality of tapered elements. Tapered sides of those elements fit flush against each other when the two members intermesh, and the members become strongly adhered to each other when the tangent of the half angle of said tapered sides is no greater than the coefficient of friction of the material of the contacting surfaces. Each of the members has a plurality of electrically conductive segments in position to make good electrical contact when the members intermesh.

21 Claims, 12 Drawing Sheets

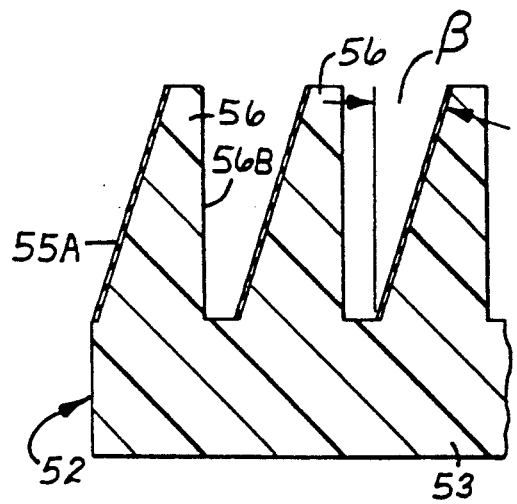
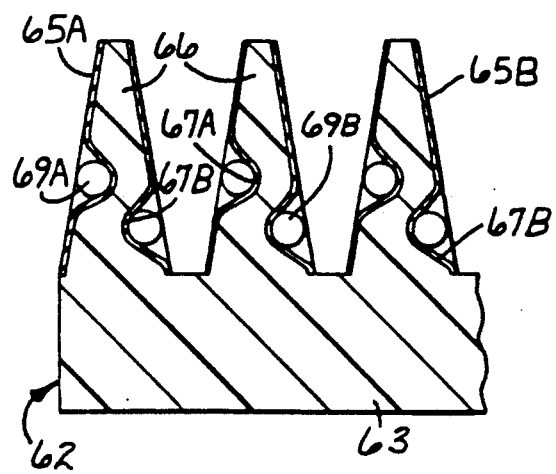
Fig. 6
Fig. 7
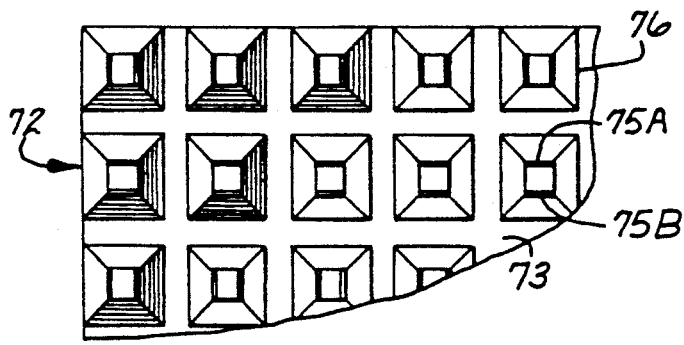
Fig. 8
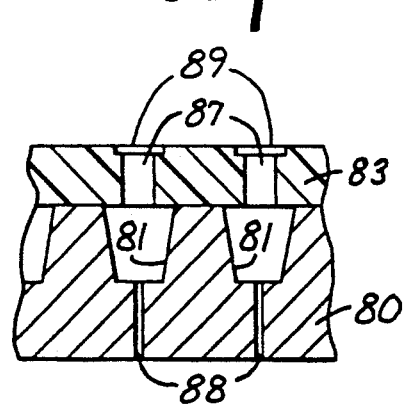
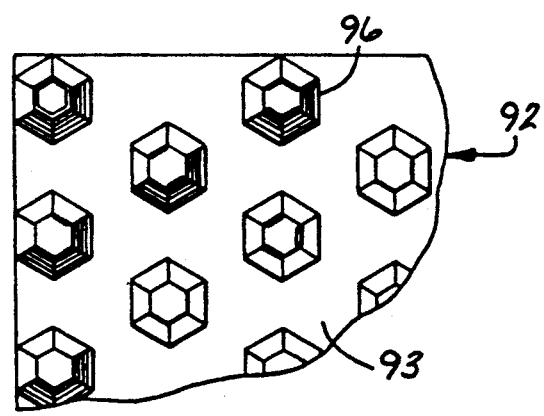
Fig. 9
Fig. 10

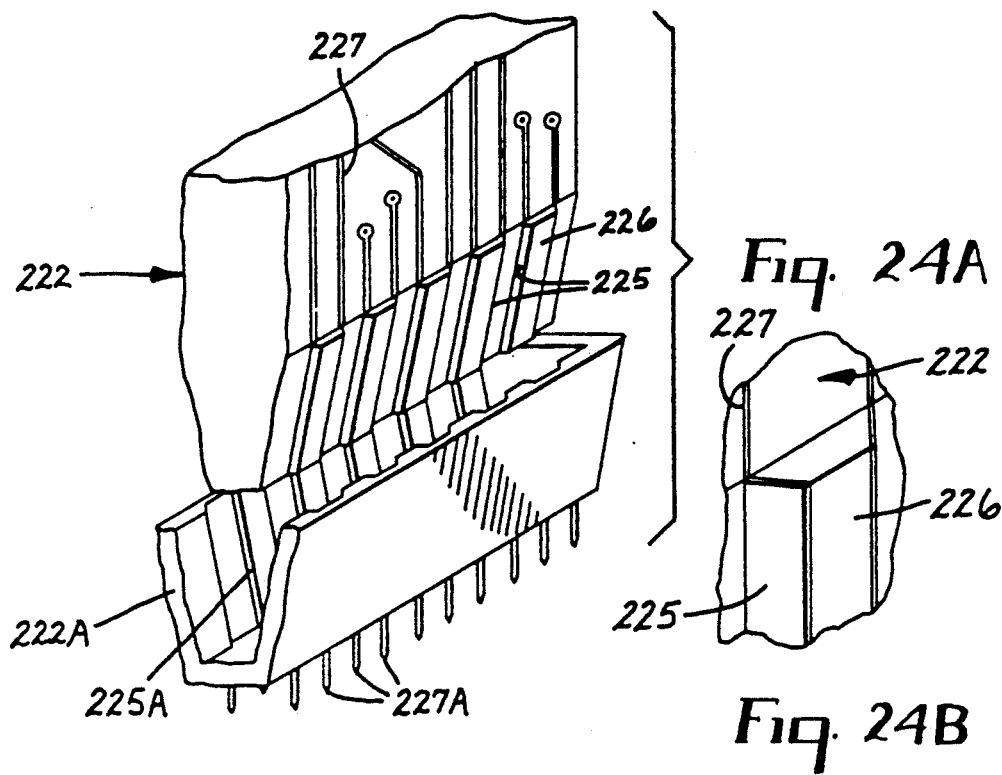
Fig. 24A
Fig. 24B
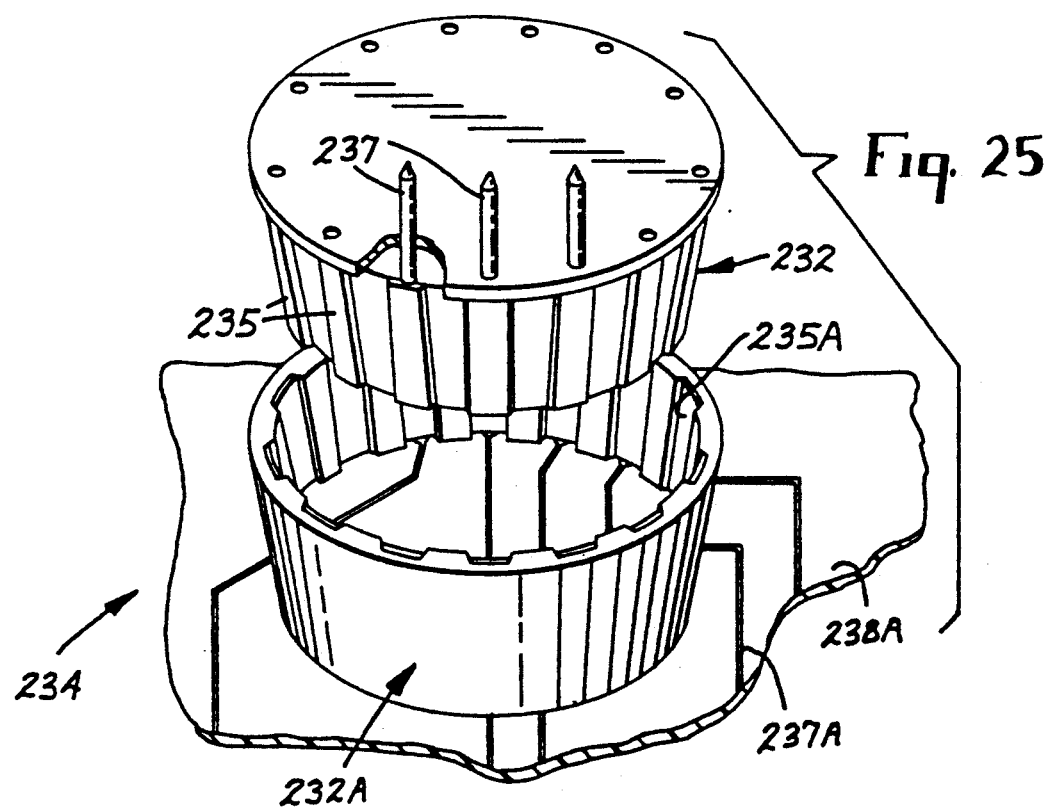
Fig. 25

MINIATURE MULTIPLE CONDUCTOR ELECTRICAL CONNECTOR

This is a continuation of application Ser. No. 07/510,573 filed Apr. 18, 1990, now U.S. Pat. No. 5,071,363.

BACKGROUND OF THE INVENTION

1. Field of the Invention

The invention concerns multiple conductor electrical connectors that can be used for electrically interconnecting two electronic components that have large numbers of electrical terminals. The invention is particularly concerned with multiple conductor electrical connectors by which large arrays of closely spaced terminals can be interconnected, e.g., microchips and microchip interconnects.

2. Description of the Related Art

In order to electrically interconnect two arrays of electrical terminals, each terminal of one array can be connected to one of a plurality of pins, each of which fits into a spring-loaded socket that is connected to a terminal of the other array. When the terminals have a "fine pitch," i.e., are closely spaced, as are those of microchips and microchip interconnects, pin-and-socket connectors tend to be expensive and difficult to manufacture.

European Pat. Publication No. 0,223,464 published May 27, 1987 (Reylek et al.) is concerned with multiple conductor electrical connectors for fine pitch electronic components, e.g. 0.1 mm between the centers of adjacent terminals. The EPO patent publication describes two prior techniques for electrically interconnecting facing terminal arrays of two electronic components. One technique utilizes "flip chip" devices, and another utilizes a layer of polymer containing electrically conductive particles that deform when the two components are pressed against the polymeric layer so that each deformed particle provides an electrical path between opposed terminals. When the polymer is an adhesive, it can bond the two components together. When the polymer is not an adhesive, a clamp is used to maintain the electrical connections and must be so designed and used that sufficient pressure is applied to ensure good electrical contact at every connection. Whether or not the polymer is an adhesive, it should electrically insulate adjacent particles from each other.

Like the particle-containing polymeric layer produced by the second technique, the connector of the Reylek EPO publication has a polymeric layer containing electrically conductive elements except that in the Reylek connector, each of the elements is a coating of electrically conductive material and the elements can be uniformly spaced. A Reylek connector can be made by forming a pattern in a rigid plastic sheet, depositing a metal layer over the pattern, covering the metal layer with a polymeric matrix, removing the plastic sheet, covering the thus-exposed side of the metal layer with a polymeric matrix, and then grinding off polymer at both sides until segments of the metal layer extend only between two flat faces of the polymeric matrix. The metal segments can have a variety of shapes, e.g., flat rectangles, cylinders, cones, pyramids, hemispheres, squares, and cubes that can be open on one or both ends. When the polymeric matrix is an adhesive, it can bond the two electronic components together, but this prevents the components from being disconnected and reconnected.

U.S. Pat. No. 4,875,259 (Appeldorn), which does not mention electrical connectors, provides intermeshable members that can be used in pairs as mechanical fasteners. Each of the members has a structured surface including a plurality of tapered elements, each element having at least one side inclined relative to a common plane at an angle sufficient to form a taper. Upon being intermeshed with the tapered sides of the two elements in contact, the pair of members become frictionally interlocked when the tangent of the half angle of the tapered sides is no greater than the coefficient of friction of the material of the contacting surfaces. Individual tapered elements can be exceedingly small.

The disclosure in the Appeldorn patent is incorporated herein by reference.

SUMMARY OF THE INVENTION

The invention provides multiple conductor electrical connectors that can electrically interconnect two electronic components having fine pitch arrays of terminals. Other than pin-and-socket electrical connectors, those of the invention are believed to be the first that can be connected and reconnected without using a clamp.

A multiple conductor electrical connector of the invention includes a pair of intermeshable articles which, like those of the Appeldorn patent, comprise:

a first member having at least one major surface and at least a portion of said major surface being a structured surface;

a second member having at least one major surface and at least a portion of said major surface being a structured surface; and said structured surfaces of said first member and said second member each including a plurality of solid tapered elements, each element having at least one side inclined relative to a common plane in each of said members at an angle sufficient to form a taper so that said element of said first member may mesh with said elements of said second member when brought into contact with one another and said first member may adhere to said second member at least partially because of the frictional force of adherence of said contacting sides of said elements o said first member and said elements of said second member and wherein the tangent of the half angle of the tapered sides of the element is no greater than the coefficient of friction of the material of the contacting surfaces.

The multiple conductor electrical connector of the invention differs from Appeldorn's intermeshable articles in that:

each of said members has an electrically insulative body; and an electrically conductive segment is at a surface of at least one of said contacting sides of an element of one member in position to contact an electrically conductive segment of the other member when the members intermesh.

For most uses, there is an electrically conductive lead at each of said electrically conductive segments, and some of the leads can be utilized to carry off heat such as may be generated by electricity flowing through the electrical connector and electronic components which it interconnects. For the same purpose, one or both of the intermeshable members can carry heat conductors, each of which is connected to a heat sink, and they need not be electrically conductive.

The novel multiple conductor electrical connector is primarily useful when it is miniature in size for electrically interconnecting arrays of closely spaced terminals. For most uses, each of its pair of intermeshable members will have at least 10 and as many as 500 or more tapered elements at the same density as the terminals of the electronic components to be interconnected. For example, there may be from 0.5 to 20 conductive segments per mm. and their height may be from 0.1 to 10 mm to accommodate multiple terminals now on the market.

By making both members of the novel connector identical, inventory is simplified. While intermeshable members consist of male tapered elements on one member of a novel connector and female tapered elements on the other. For example, see FIGS. 11, 21, 23, 24 and 25 of the drawing. When each member of a novel connector has both male and female tapered elements, the members can be identical.

The electrically insulative body of each intermeshable member of the novel connector preferably is formed by replicating the surface of a reusable master, which surface is the negative of the tapered elements that are to be formed. For high speed replication, the electrically insulative material of the body of the novel connector is a thermoplastic resin that can be cast, extruded or injected onto, or otherwise formed on, the surface of the master which preferably is heat conductive to provide quick solidification, cooling, and reuse. A preferred material for the master is stainless steel.

A number of commercially available thermoplastic resins can precisely and stably replicate the surface of a master and so are useful for making the electrically insulative bodies of the novel connector. The resulting electrically insulative bodies should be resistant to temperatures and other conditions to be encountered in use, and the selection of material for the bodies should take into account the desirability of avoiding any need to change or otherwise renew the master until thousands of the intermeshable members have been formed. Preferred thermoplastic resins for the electrically insulative bodies include commercially available polyesters such as poly(ethylene terephthalate) and liquid crystal polymers. Other useful thermoplastic resins include acrylics, vinyls, polyethylenes and polycarbonates, all of which are readily available at reasonable cost. Other useful materials that are electrically insulative and can precisely replicate a master include other polymeric materials, ceramics, and glasses.

After forming the electrically insulative body of an intermeshable member, surfaces of its tapered elements can be provided with electrically conductive segments by the sequential steps of:

(a) depositing a thin film of electrically conductive metal, e.g., by vapor deposition, (b) electroplating a thicker layer of the same or a different electrically conductive metal, and (c) removing portions of the metal to separate it into segments that are electrically insulated from each other.

Those electrically conductive metal segments can substantially completely cover every tapered side of every element or only selected portions thereof. Some or all of the tapered sides can be completely uncovered. Because some polymeric materials have substantially higher coefficients of friction in contact with each other than do inexpensive electrically conductive materials, a significant proportion of each tapered side of some elements can be left uncovered by the electrically conductive material, hence providing greater leeway in designing the novel connector. For example, each intermeshable member of a multiple conductor electrical connector of the invention can have first and second tapered sides and electrically conductive segments covering only the first tapered sides.

Each intermeshable member of a novel electrical connector can be a polymeric material which has such a high coefficient of friction in contact with itself that uncovered tapered sides can adhere so strongly that the connector cannot be disconnected at room temperature without damage but can be disconnected when cooled to a temperature that does not damage the connector. A polymer that has relatively high Tg, e.g., from 40° to 80° C, and is nontacky at room temperatures can have an exceedingly high coefficient of friction in contact with itself.

Copper is useful for the electrically conductive segments of the novel connector, it being low in cost and highly electrically conductive. Where cost is of less importance, silver and gold are more preferred. Gold segments can be readily formed to have exceedingly smooth surfaces. When smooth, gold has a very high coefficient of friction in contact with itself.

Although the electrically conductive segments of the novel connector can be quite thin compared to the electrically insulative bodies, for some uses they should be relatively thick, e.g., where the electric current is relatively high. Higher electric current can also be accommodated by leaving several adjacent segments interconnected, or a portion of each member of the novel electrical connector can be formed entirely of electrically conductive material. Such a wholly conductive area can also or, alternatively instead be utilized in a heat sink.

BRIEF DESCRIPTION OF THE DRAWINGS

The present invention will be more fully described with reference to the accompanying drawings, all figures of which are schematic. In the drawings:

FIG. 6 and 7 are cross sectional views through one member of each of fourth and fifth multiple conductor electrical connectors of the invention;

FIGS. 8 and 10 are top views of one member of each of sixth and seventh multiple conductor electrical connectors of the invention;

FIG. 9 is a cross sectional view through apparatus useful for making a member which is similar in appearance to that shown in FIG. 8;

FIG. 24A is a perspective view of a seventeenth multiple conductor electrical connector of the invention;

FIG. 24B is a magnified partial view of one of the elements of FIG. 24A;

FIG. 25 is a perspective view of an eighteenth multiple conductor electrical connector of the invention.

DETAILED DESCRIPTION OF PREFERRED EMBODIMENTS

Figure 1:
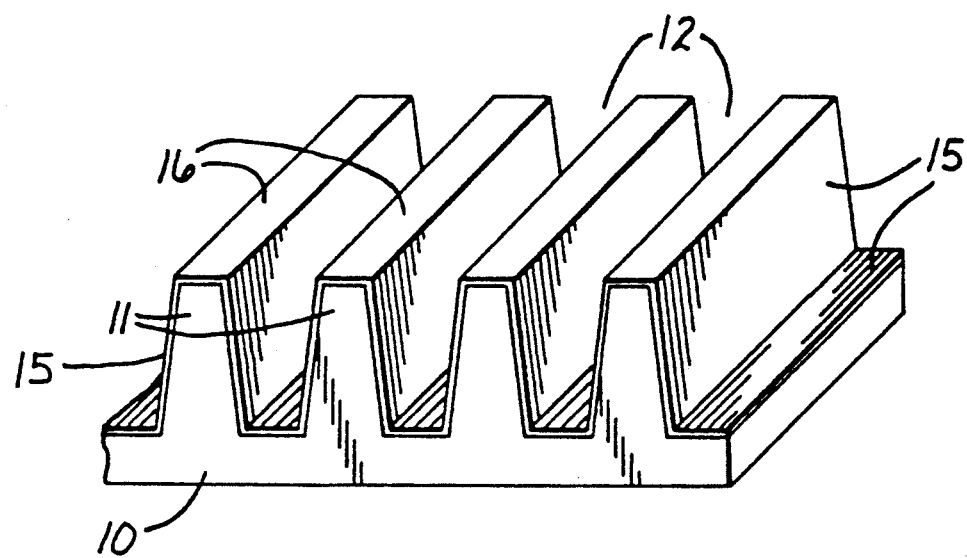
FIGS. 1 and 2 are perspective views illustrating stages of a method for making one intermeshable member of a first multiple conductor electrical connector of the invention.
Figure 2:
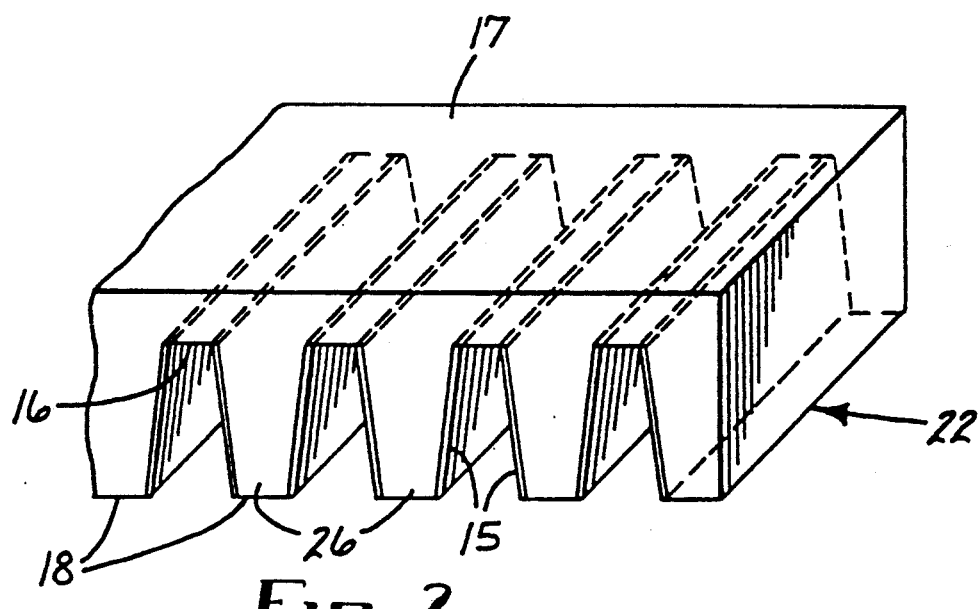

In FIG. 1, a major surface of a stainless steel master 10 is first formed to have a plurality of spines 11 and furrows 12. Over the spines and furrows is formed a thin layer 15 of electrically conductive metal. FIG. 2 shows that after removing the metal from the apices 16 of the spines 11, a relatively thick layer of a polymeric, electrically insulative material 17 is formed over the metal and exposed apices. The master 10 is then removed, and the metal is removed at the crown 18 of each ridge 26 of the resulting intermeshable member 22. That and an identical member can be intermeshed to provide a multiple conductor electrical connector 24 shown in FIG. 3. Each intermeshable member 22 has an electrically insulative body 23, and along its major surface is a structured surface including a plurality of tapered elements (ridges 26), each having two identically tapered sides, each of which is covered with a metal segment 15A or 15B of the electrically conductive metal layer 15. As intermeshed, the metal-covered tapered sides fit flush against each other in good electrical contact. For the two intermeshing members 22 to adhere to one another, the tangent of the half angle of their tapered sides should be no greater than the coefficient of friction of the contacting electrically conductive metal segments.

Figures 3, 5:
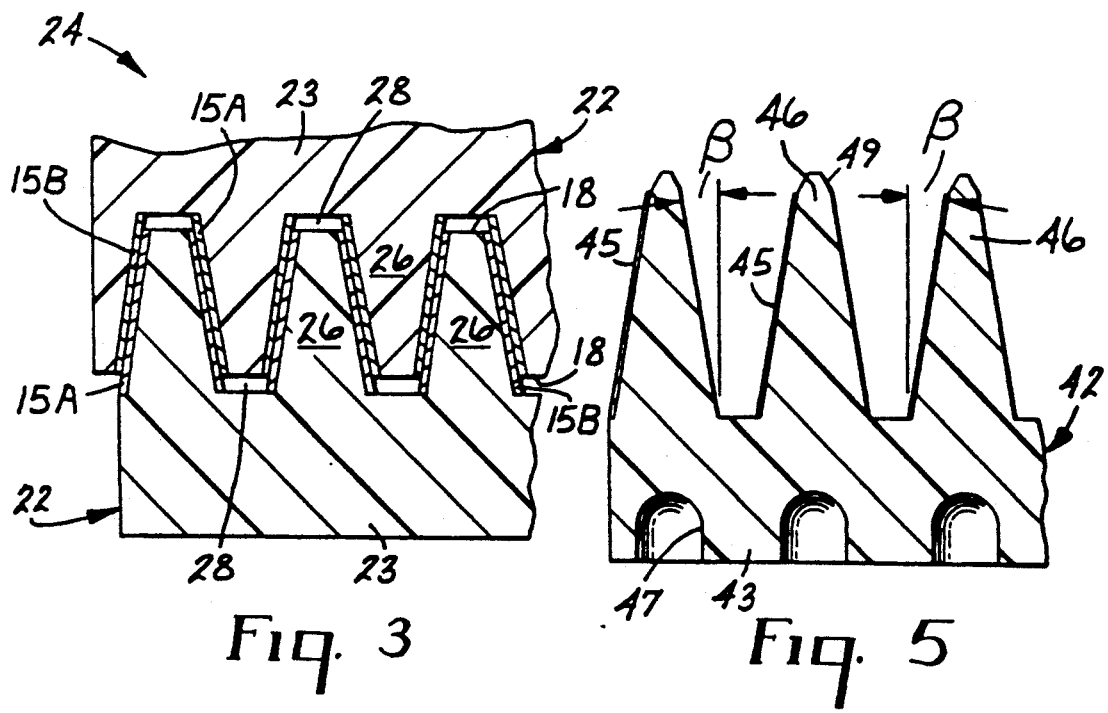
FIG. 3 is a cross sectional view through a pair of said first multiple conductor electrical connectors.
FIG. 5 is a cross sectional view through one member of a third multiple conductor electrical connector of the invention.

As is illustrated in FIG. 3, each element 26 is sized such that when the elements are brought into contact with one another to mesh, they will contact each other only along the sides of elements, leaving a cavity 28 beyond the crown 18 of each element, thus ensuring side contact. However, there need be no cavity as long as the forces of contact at the crowns is no greater than the frictional forces associated with the sides.

The thickness of the intermeshable members 22 depends upon the particular application. Thus, the member 22, for some applications, may be formed of a thin, flexible sheet or film which can be flexed to allow separation and repositioning.

Figure 4:
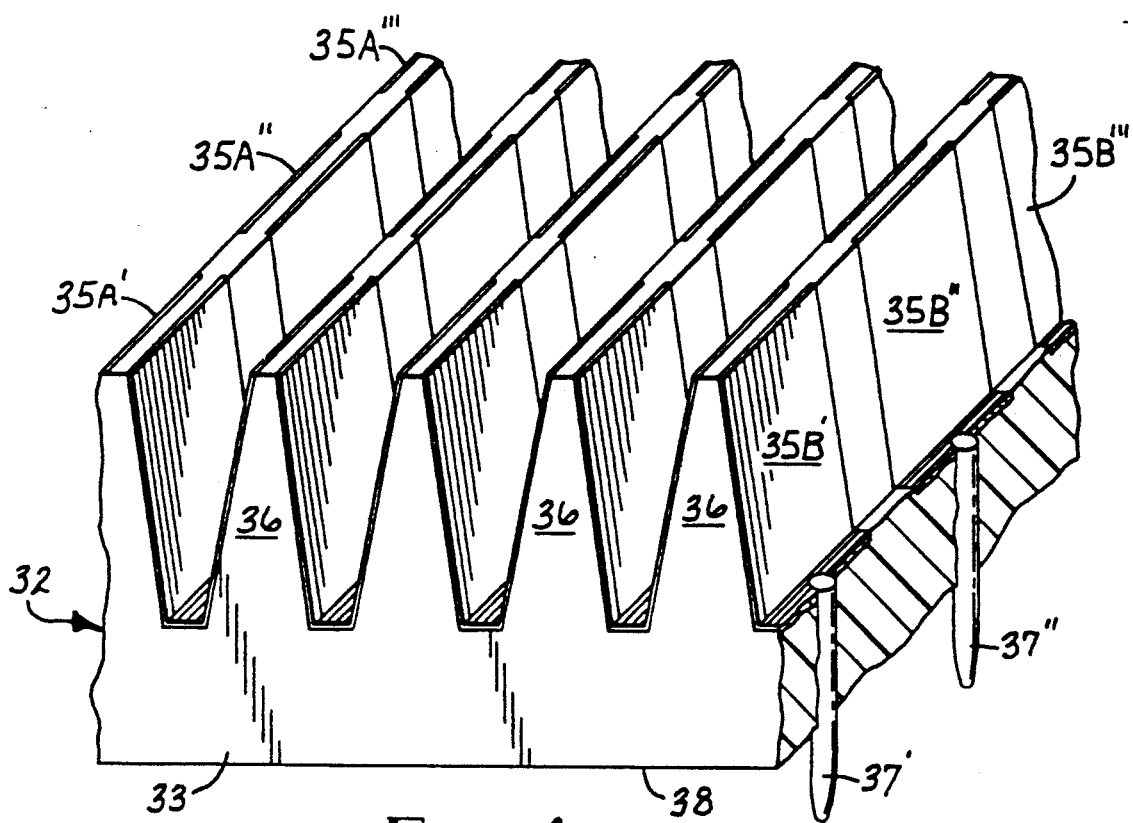
FIG. 4 is a perspective view of one member of a second multiple conductor electrical connector of the invention.

In FIG. 4, one intermeshable member 32 of a second multiple conductor electrical connector has an electrically insulative body 33 formed to have a plurality of tapered elements (ridges) 36, each having two identically tapered sides. Each side is covered with at least three metal segments 35A', 35A", 35A''' and 35B', 35B", 35B''', each of which is inset into the tapered side so that the metal and insulative surfaces of the tapered side lie in a plane. Both of the metal-to-metal contacts and the insulative-to-insulative contacts contribute frictional force to the interlocking of the intermeshable members. The metal segments are insulated from each other except being interconnected across each groove between adjacent elements 36. At each such interconnection is a metal pin 37', 37" that protrudes beyond the under surface 38 of the insulative body 33. When the member 32 and a second corresponding member are intermeshed, current can flow through each pin 37' to both adjacent metal segments 35A' and 35B', to a pair of corresponding metal segments on a second intermeshing member (not shown), and to the pin at the groove between those metal segments of the corresponding member.

In FIG. 5, one intermeshable member 42 of a third multiple conductor electrical connector has an electrically insulative body 43 formed to have a plurality of tapered elements (ridges) 46, each having two identically tapered sides, one covered with a metal segment 45 and the other uncovered. The underside of the electrically insulative body 43 is formed with stress-relief recesses 47. The crown of each element has a chamfer 49 to facilitate alignment. When the member 42 and an identical member intermesh, their metal-covered tapered sides fit flush against each other in good electrical contact. For the two members to adhere to one another, the tangent of the half angle $\beta$ of their tapered sides should be no greater than the coefficient of friction of the electrically conductive metal in contact with itself.

In FIG. 6, one intermeshable member 52 of a fourth multiple conductor electrical connector has an electrically insulative body 53 formed to have a plurality of tapered elements (ridges) 56, each having one tapered side which is covered with a metal segment 55A. The half angle $\beta$ of the tapered side is indicated in FIG. 6. The other side 56B is uncovered, and its half angle is zero. When two members 52 intermesh, both their metal segments 55A and their uncovered sides 56B fit flush against each other.

In FIG. 7, one intermeshable member 62 of a fifth multiple conductor electrical connector has an electrically insulative body 63 formed to have a plurality of tapered elements (ridges) 66, each having two identically tapered sides formed with longitudinal recesses 67A and 67B. Covering each tapered side and the wall of each recess is a metal segment 65A or 65B. Fitting into each metal-covered recess 67A and 67B is an electrically conductive wire 69A and 69B, respectively, which wires extend longitudinally beyond the member 62 to act as leads.

In FIG. 8, one intermeshable member 72 of a sixth multiple conductor electrical connector has an electrically insulative body 73 formed to have a plurality of tapered elements 76, each in the form of a truncated pyramid having four tapered sides, two of which are covered with metal segments 75A and 75B.

FIG. 9 shows a master metal mold 80 that has a plurality of open cavities 81, the walls of which form truncated pyramids. Covering the cavities is a polymeric substrate (film) 83 that has good heat resistance such as a polyimide. At each of the cavities 81, the polymeric film is formed with a passage 87 through which a low-melting electrically conductive metal can be injected to fill the cavities, after which the polymeric film 83 can be stripped from the mold, carrying with it an array of solid metallic truncated pyramids. In the resulting intermeshable member, the polymeric film 83 forms an electrically insulative body, the solid metallic truncated pyramids are electrically conductive segments, and the column of metal filling each f the passages 87 can serve as a lead. At the exposed surface of the polymeric film, the passages 87 are formed with counterbores 89 to provide a bead on the end of the metal column to lock the polymeric film to the intermeshable member. To bleed off air, the mold 80 can have a tiny channel 88 leading from each cavity to the opposite surface.

In FIG. 10, one intermeshable member 92 of a seventh multiple conductor electrical connector has an electrically insulative body 93 formed to have a plurality of tapered elements 96, each having six tapered sides. One or more of those tapered sides can be covered with metal segments, or the elements can be solid metal segments.

Figure 11:
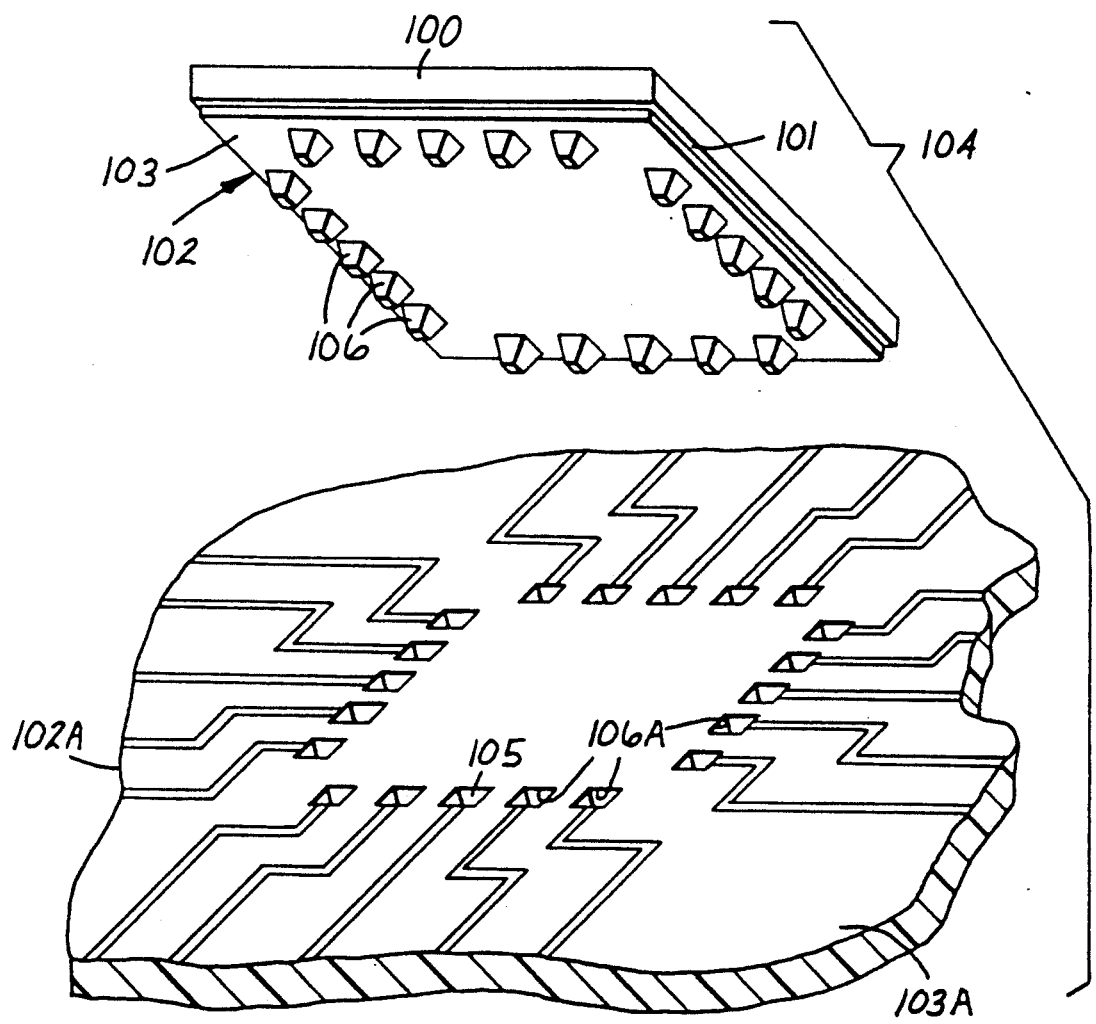
FIG. 11 is a fish-eye view of an eighth multiple conductor electrical connector of the invention, one member of which has a plurality of tapered elements similar to those of the member shown in FIG. 8.

In FIG. 11, the electrically insulative body 103 of an intermeshable member 102 is adhered to a microchip 100, such as devices that are sometimes referred to as "gate arrays", by an adhesive layer 101 that is filled with laterally spaced, soft silver particles. Formed on the exposed surface of the insulative body 103 are a plurality of electrically conductive elements 106 in the form of truncated pyramids. From the base of each truncated pyramid, a column of electrically conductive metal (not shown) extends to the hidden surface of the insulative body and is electrically connected to pads (not shown) of the underside of the microchip 100 by the silver particles in the adhesive layer 101. Each of the elements 106 can intermesh with metal segments 105 lining pyramidal openings 106A in a printed circuit board 103A to provide an eighth multiple conductor electrical connector 104 of the invention. In yet another embodiment, the pyramidal elements 106 can be solid metal formed directly on the microchip by laying against the surface of the microchip 100 a heat-resistant film that has been formed with cavities, each in the shape of a truncated pyramid. The film is stripped away after filling the cavities with metal.

Figure 12:
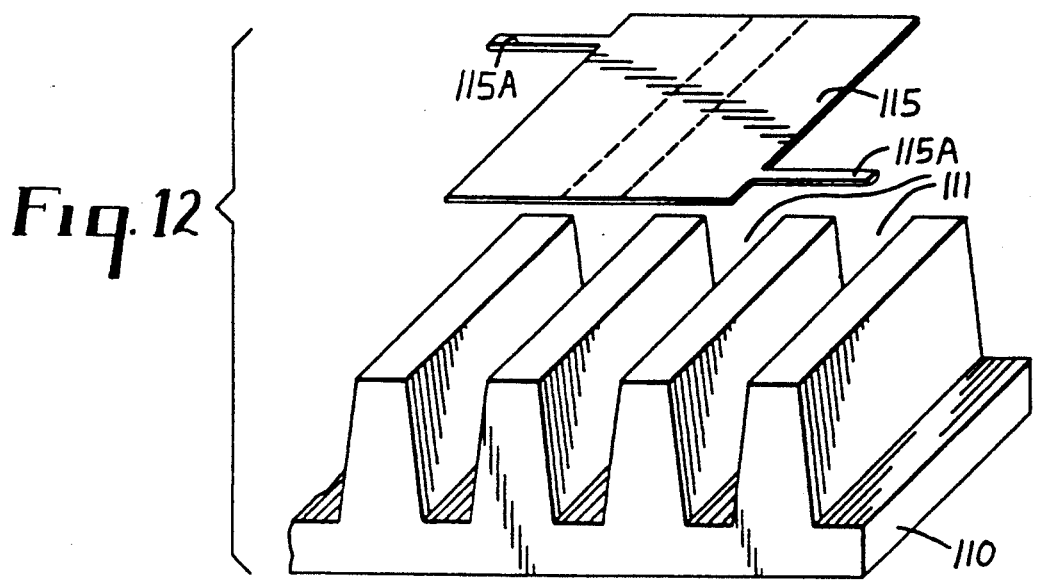
FIGS. 12-14 are perspective views illustrating stages of a method for making a ninth multiple conductor electrical connector of the invention.
Figure 13:
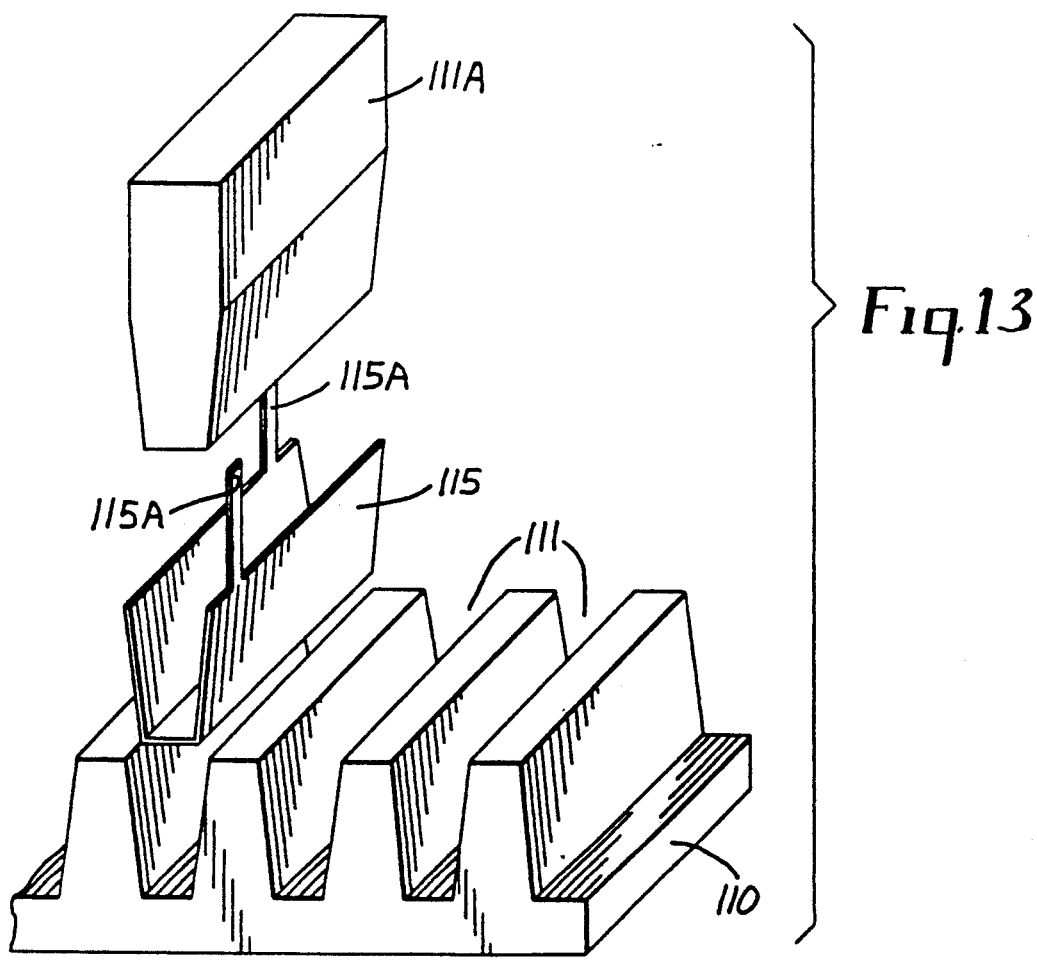
Figure 14:
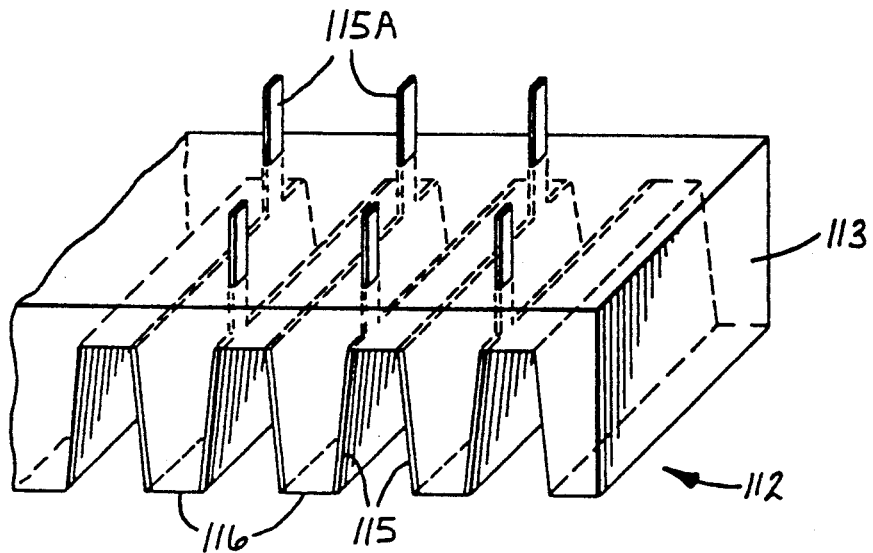

FIG. 12 shows a stainless steel master 110 and a piece of electrically conductive metal sheet 115 in position to be forced, as shown in FIG. 13, into a furrow 111 of the master by a tool 111A. After so inserting a metal piece into each furrow, a relatively thick layer of a polymeric, electrically insulative material 113 is formed over the metal, as shown in FIG. 14, leaving protruding electrically conductive leads 115A. After removing the master 110, metal is removed from the crown of each element (ridge) 116 of the resulting intermeshable member 112 which, with an identical member, provides a ninth multiple conductor electrical connector 114 shown in use in FIGS. 16 and 17.

Figure 15:
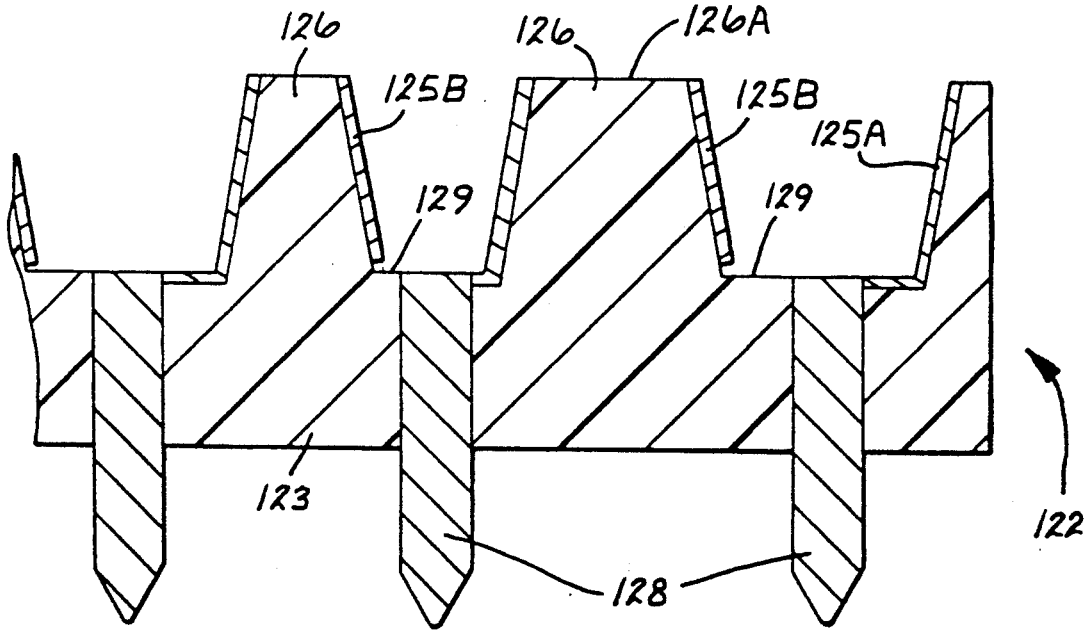
FIG. 15 is a cross sectional view through a tenth multiple conductor electrical connector of the invention.

In FIG. 15, one intermeshable member 122 of a tenth multiple conductor electrical connector has an electrically insulative body 123 formed to have a plurality of tapered elements (ridges) 126, each having two tapered sides. Press fit into bores at each groove between adjacent ridges are electrically conductive pins 128. An electrically conductive metal layer 125 has been applied across the tapered sides and grooves and then cut away at 129 on one side of each pin so that each pin is electrically connected to only one set of metal segments 125A. Hidden behind each of the electrically conductive pins 128 is another pin where the metal layer is cut away to connect the hidden pins to the other metal segments 125B.

The intermeshable member 122 of FIG. 15 incorporates two means for preventing misalignment. First, the grooves between adjacent ridges 126 have differing depths. Second, the grooves are of differing widths, and the larger crowns 126A of the ridges are too wide to fit into the narrower grooves. A third alignment means (not shown) can be provided by forming each of the intermeshable members with a relatively large pin or ridge and mating socket or groove at each end of the tapered elements. Such relatively large ridge-groove elements preferably have tapered sides, the tangent of the half angle of which is no greater than the coefficient of friction of the materials of their contacting surfaces.

Figure 16:
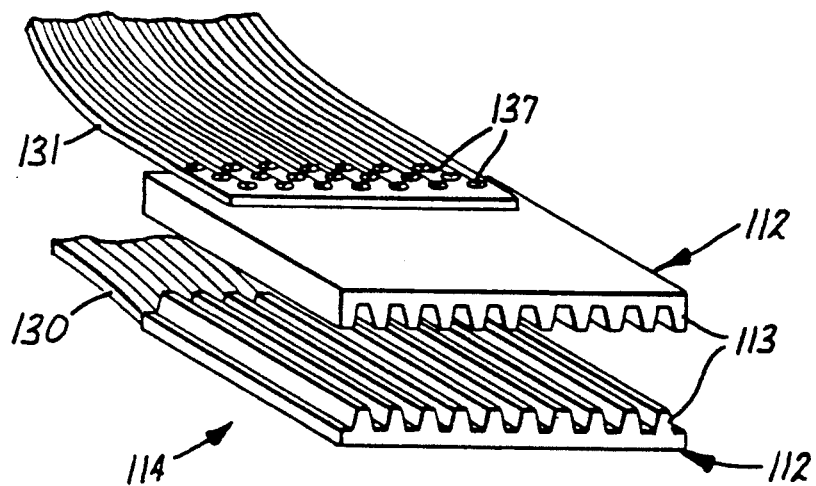
FIG. 16 is a perspective view showing the use of said ninth multiple conductor electrical connector to interconnect two flexible circuits or flat ribbon cables.

In FIG. 16, two intermeshable members 112, made as shown in FIGS. 12–14, are in position to be used to interconnect disconnectably two flexible circuits or ribbon cables 130 and 131. Each conductor of each flexible circuit or ribbon cable terminates at an electrically conductive socket 137 that receives one of the leads 115A of a member 112.

Figure 17:
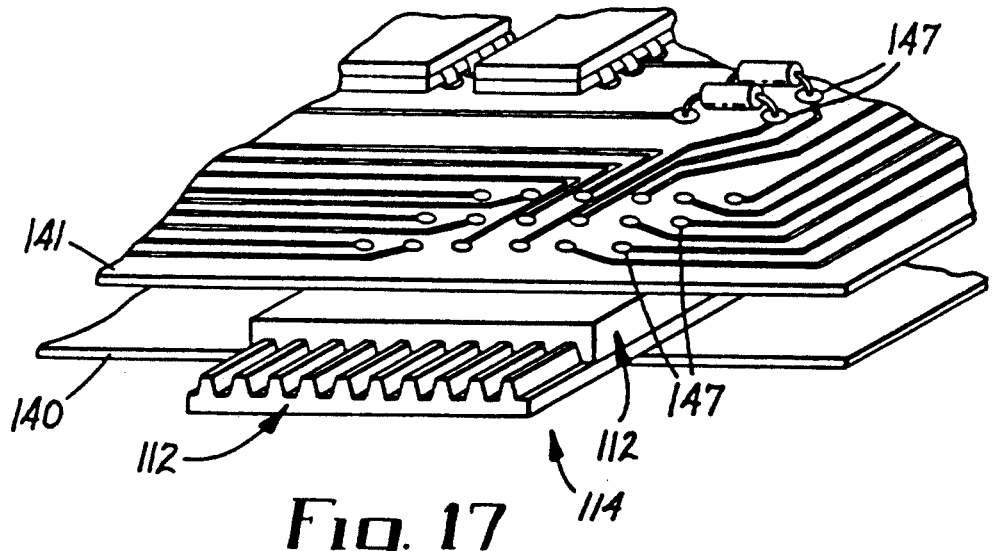
FIG. 17 is a perspective view showing the use of said ninth multiple conductor electrical connector to interconnect two printed circuit boards.

In FIG. 17, two intermeshable members 112, made as shown in FIGS. 12–14, are intermeshed to interconnect disconnectably two printed circuit boards 140 and 141. Each of the leads 115A is soldered to a pad 147 of one of the printed circuit boards.

Figure 18:
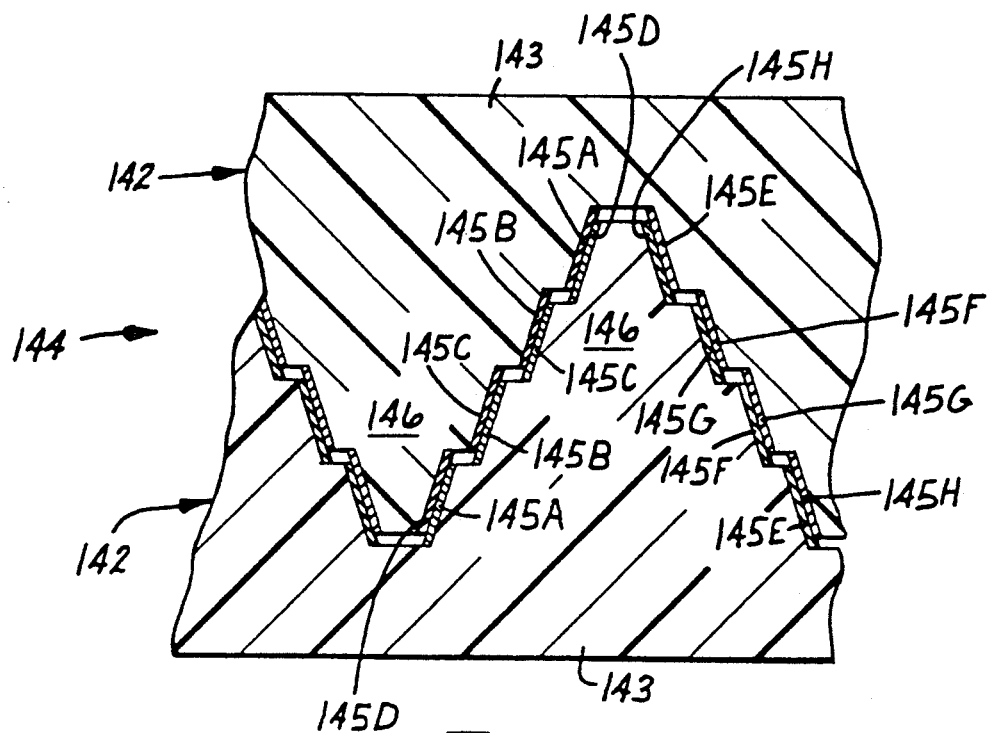
FIG. 18 is a cross sectional view through an eleventh multiple conductor electrical connector of the invention.

In FIG. 18, two identical intermeshable members 142 form an eleventh multiple conductor electrical connector 144. Each member 142 has an electrically insulative body 143 formed to have a plurality of tapered elements (ridges) 146, on each wall of which are four tapered sides. Covering each of the tapered sides is a thin metal segment 145A–D on one wall and 145E–H on the other. Metal segments of each member fit flush against corresponding metal segments on the other, and leads (not shown) extend longitudinally from each member to opposite ends of the connector.

Figure 19:
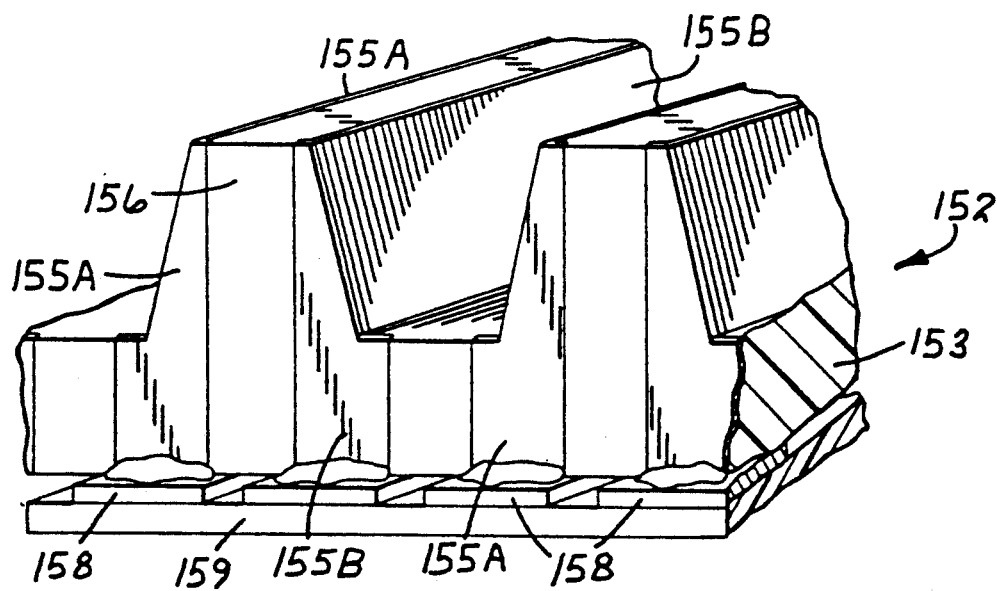
FIG. 19 is a perspective view of one member of a twelfth multiple conductor electrical connector of the invention that has been connected to a printed circuit board.

In FIG. 19, one intermeshable member 152 of a twelfth multiple conductor electrical connector of the invention has an electrically insulative body 153 formed to have a plurality of tapered ridges 156, each having two identically tapered sides. Covering each tapered side is a metal segment 155A or 155B, each of which extends across the front face of the member to its undersurface. Each extension of the metal segments 155A and 155B is soldered to a pad 158 of a printed circuit board 159. In order to make the intermeshable member 152, the front face of the insulative body 153 has been formed with recesses in the areas of the extensions of the metal segments 155A and 155B. Then after applying metal to the entire surface of the insulative body 153 except its undersurface, its surface has been abraded to remove metal at the crown of each ridge 156 and between each of the metal segments 155A and 155B.

Figure 20:
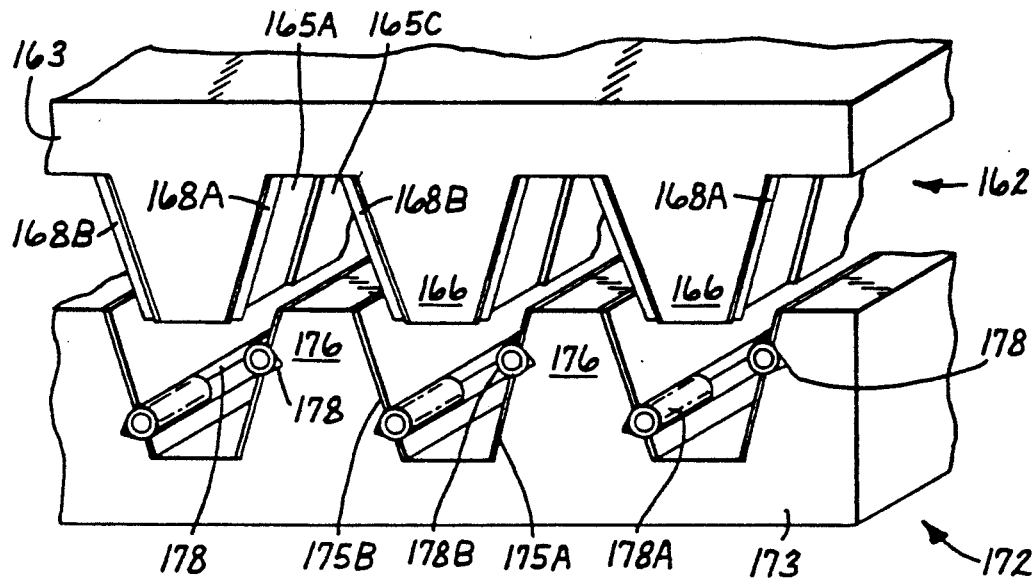
FIG. 20 is a perspective view of a thirteenth multiple conductor electrical connector of the invention.

In FIG. 20, a first intermeshable member 162 has an electrically insulative body 163 that is formed with a plurality of elements (ridges) 166. The identically tapered sides of the ridges have been recessed in part so that when covered with metal, a portion 165A of each metal segment is recessed with respect to another portion 165C. Electrically connected to each of the recessed portions is an electrically conductive knife edge 168A or 168B. Intermeshable with the first member 162 is a second member 172 which has an electrically insulative body 173 that is formed with a plurality of elements (ridges) 176. Each identically tapered side of each of the ridges 176 is covered with a metal segment 175A or 175B except at a longitudinal recess 178. Fitting into each recess is an insulated electrically conductive wire 178A or 178B, which wires extend longitudinally beyond the member 172 to act as leads. When the two members 162 and 172 intermesh, the knife edges 168A and 168B cut through the insulation of each of the wires 178A and 178B, respectively, thus electrically interconnecting the electrically conductive core of each wire to both of the adjacent metal segments, e.g., the core of the wire 178B through a knife 168A to the metal segment 165 A & C, and from there to the metal segment 175A. The two members 162 and 172 adhere to one another when the tangent of the half angle of their tapered sides is no greater than the coefficient of friction of the metal where the portion 165C fits flush against the metal segment 175A.

Figure 21:
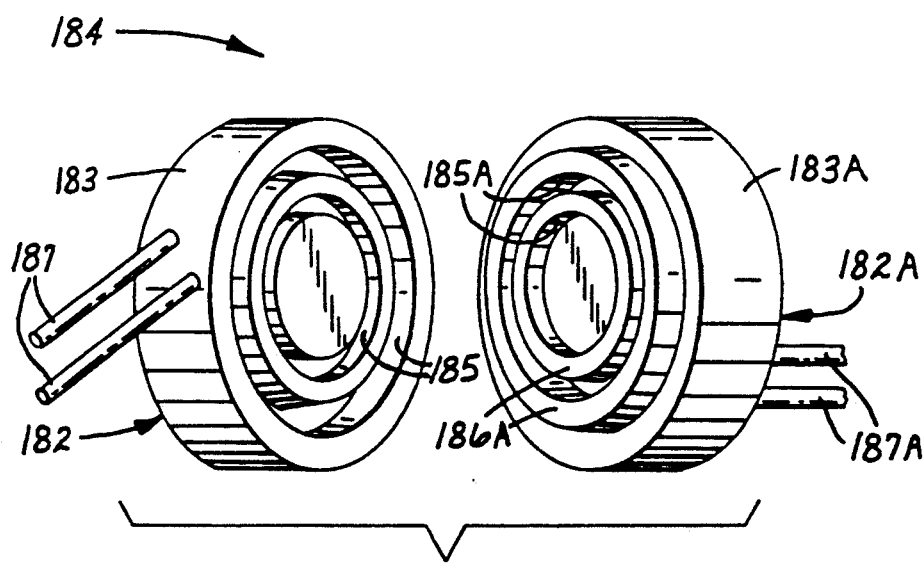
FIG. 21 is a fish-eye view of a fourteenth multiple conductor electrical connector of the invention.

In FIG. 21, a first intermeshable member 182 of a multiple conductor electrical connector 184 has an electrically insulative body 183 which is formed with annular elements (grooves), the identically tapered sides of which are faced with electrically conductive segments 185. The second intermeshable member 182A has an electrically insulative body 183A which is formed with annular elements (ridges) 186A, the identically tapered sides of which are faced with electrically conductive segments 185A. An electrically conductive wire 187 is soldered to each of the electrically conductive segments 85 of the first member 182, and an electrically conductive wire 187A is soldered to each of the electrically conductive segments 185A of the second member 182A. When intermeshed, the metal-covered tapered sides of the ridges and grooves fit flush against each other in good electrical contact and are well adhered because the tangent of the half angle of their tapered sides is no greater than the coefficient of friction of the electrically conductive segments 185 and 185A in contact with each other.

Figure 22:
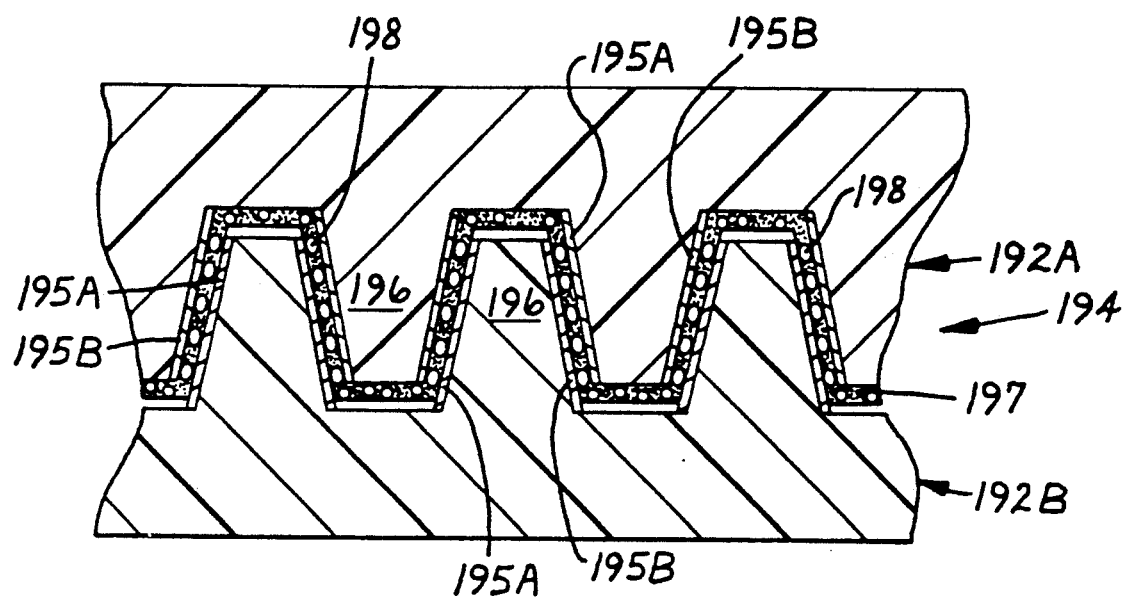
FIG. 22 is cross sectional view through a fifteenth multiple conductor electrical connector of the invention.

In FIG. 22, identical intermeshable members 192A and 192B of a fifteenth multiple conductor electrical connector 194 intermesh except being separated at the identically tapered sides of their elements (ridges) 196 by a matrix of material, such as a layer 197 of uniform thickness that has been adhered to and covers the structured surface of the upper member 192A. The polymeric layer 197 is filled with laterally spaced, soft silver particles 198 which electrically interconnect metal segments 195A and 195B that cover the tapered sides of each of the ridges 196. Instead of soft particles, the adhesive can be filled with hard metal spheres when the metal segments 195A and 195B are relatively soft. See, for example, EPO Pat. Publ. No. 03330452 published 30 Aug., 1989 (Calhoun); the contents of which are incorporated herein by reference. The half angle of the tapered sides of the ridges 196 is no greater than the coefficient of friction between the polymeric layer 197 and the metal segments 195A and 195B covering the tapered sides of the member 192B. Preferably, the polymeric layer 197 is nontacky to permit the two members 192A and 192B to be disconnected and reconnected.

Figure 23:
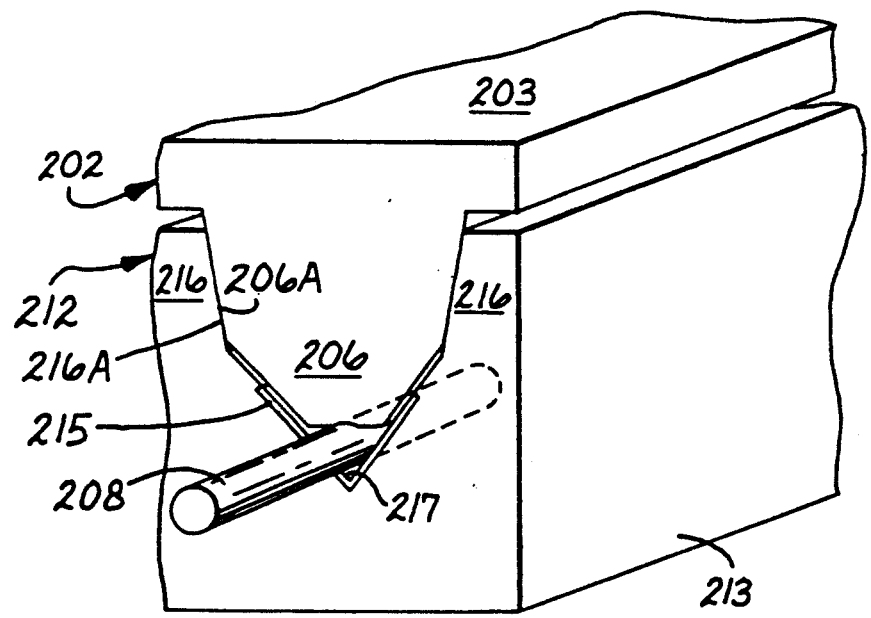
FIG. 23 is a perspective view of a sixteenth multiple conductor electrical connector of the invention.

In FIG. 23, a first intermeshable member 202 has an electrically insulative body 203 that is formed with a plurality of elements (ridges) 206, one of which is shown. Intermeshed with the first member 202 is a second member 212 which has an electrically insulative body 213 that is formed with a plurality of elements (ridges) 216, parts of two of which are shown. Each of the ridges 206 and 216 has identical dual-tapered sides. The steeply tapered sides 206A and 216A are uncovered, and their half angle is no greater than the coefficient of friction of the material of the electrically insulative bodies 203 and 213 in contact with each other. Each shallow tapered side of each ridge 216 is partly covered by a metal segment 215 that extends across a V-groove 217.

When the members 202 and 212 are intermeshed as shown with a soft metal wire 208 resting in the V-groove 217, the crown of each ridge 206 of the first member 202 presses and slightly deforms the wires into good electrical contact with the metal segments 215, thus electrically interconnecting the wire to a metal segment 215, while the steeply tapered sides 206A and 216A fit flush against each other to frictionally interlock the two members 202 and 212.

To better ensure engagement between the tapered sides 206A and 216A, the crown of each ridge 206 can be covered with a relatively soft, compressible material.

In FIG. 24A, an edge of a printed circuit board 222 has been formed at both faces with a plurality of elements (flutes) 226, each element having two tapered sides, each tapered side being covered with a metal segment 225 (as shown in greater detail in FIG. 24B) which in turn is electrically connected to a lead 227 on a face of the printed circuit board 222. The edge of the printed circuit board fits into a hollow member 222A that has an electrically insulative body. The interior side walls of the hollow member 222A are formed with grooves having tapered sides, each covered with a metal segment 225A that is electrically connected to a metal pin 227A. When the edge of the printed circuit board is lowered into the hollow member 222A, their metal segments 225 and 225A, respectively, fit flush against each other to afford both frictional interlocking and electrical interconnection.

The multiple conductor electrical connector 234 shown in FIG. 25 could be similar in construction to that of FIG. 24, but instead of having a metal segment on each side of each flute of its male member 232, the broad face of each flute is covered with a metal segment 235. Soldered to each metal segment 235 is an electrically conductive metal pin 237. Covering the broad face of each groove of the female member 232A of the electrical connector 234 is a metal segment 235A that is electrically connected (means not shown) to a lead 237A on a printed circuit board 238A.

Figure 26:
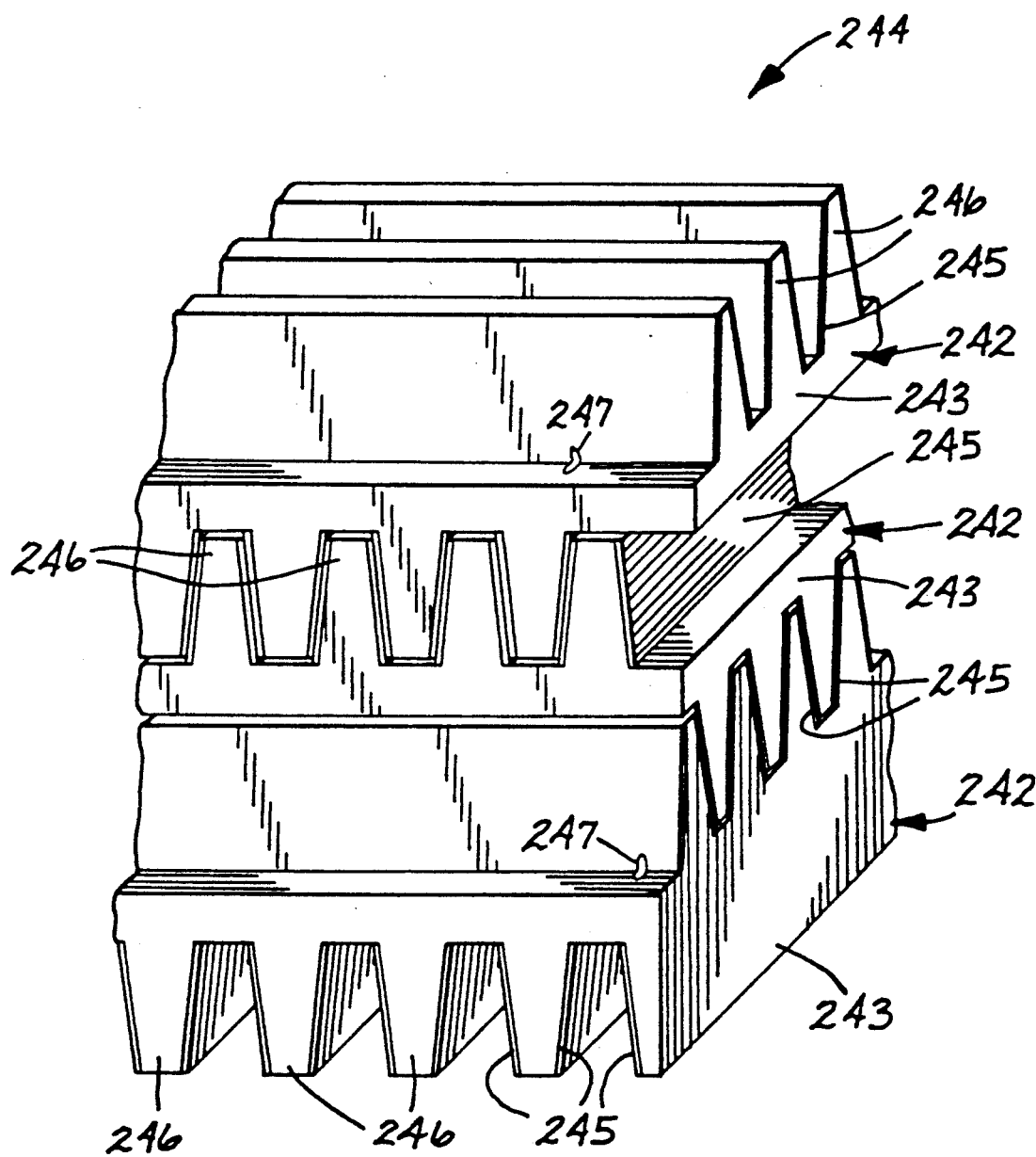
FIG. 26 is a perspective view of a nineteenth multiple conductor electrical connector of the invention.

The multiple conductor electrical connector 244 of FIG. 26 has three identical members 242, each having an electrically insulative body 243 with a structured surface at two major surfaces. Each of the structured surfaces is formed to have a plurality of tapered elements (ridges) 246, the identically tapered sides of which are covered with metal segments 245. Each of the members 242 is formed with bores 247 to receive metal pins (not shown) by which metal segments at one major face of each member can be electrically connected to metal segments at the other face. When the members 242 are brought together with their ridges 246 intermeshed, they become frictionally interlocked by the contacting metal segments 245 which thus become electrically interconnected. The aforementioned metal pins do not interfere with the frictional interlocking when they are short enough not to protrude further than the thickness of the cavity between the interlocking ridges and grooves. To the extent that the pins might interfere, the members can be offset during intermeshing.

EXAMPLE 1

A multiple conductor electrical connector was made to be similar in appearance to that of FIG. 14 The electrical insulating body 113 was glass filled polysulfone. Thirty-three 0.4-mm holes were drilled to receive pins 115A. One surface was then machined to create ridges 116 1.8-mm high on 1.25-mm centers, the tapered sides of which had a half-angle $\beta$ of 3°, with each of the tapered sides centered on one of the 0.4-mm holes After inserting a phosphor bronze pin into each hole, the structured surface was electrolessly plated with copper and then electroplated with additional copper to a total thickness of about 30 $\mu$m. Then the copper at the crowns of the ridges was abraded away, and the copper at the grooves was removed using a diamond saw.

Two of the resulting members were intermeshed in areas not occupied by pins and with an overlap of about 6 mm. Doing so created thirty-two electrical connections having resistances ranging from 19 to 250 m$\Omega$. The two members were so interlocked that they would not separate with one's fingertips except by a progressive disengagement, i.e., by pulling them apart at one end of the electrical connector that was bordered by one of the ridges.

EXAMPLE 2

A multiple connector was made by embossing a polyethylene film under heat and pressure against a metal master having a nickel surface, thus affording to the polyethylene a structured surface like that of FIG. 3. The ridges were 0.37-mm high, on 0.25-mm centers, and their tapered sides had a half-angle $\beta$ of 3°. Using a mask, copper was vapor deposited onto the structured surface to a thickness of about 0.2 $\mu$m in stripes covering 6 or 7 adjacent ridges separated by about 3 unmetallized ridges. The metallized film as cut into two members.

These were intermeshed with an overlap of about 10 mm and with 20 pairs of metallized stripes aligned. The interconnection resistance between two points 2.54 cm apart including the 10 mm overlap of each contacting pair of stripes was from 20 to 30 ohms. The two members were interlocked such that to separate them with one's fingertips, it was necessary to pull them apart at one end of the electrical connector.

What is claimed is:

1. A multiple conductor electrical connector comprising: first and second members, each having a connecting means provided on a major surface thereof for engagement with one another so as to physically fasten said first and second members together, said connecting means for each member comprising a structured surface including a plurality of tapered elements, said tapered elements each having a tapered side inclined relative to a common plane in each of said members so that when the connecting means of said members are engaged with one another said tapered elements of said first member intermesh with tapered elements of said second member while contact surfaces of said tapered sides of said tapered elements are engaged with one another without interlocking of said tapered elements, said first and second members each comprising an electrically insulative body and a plurality of electrically conductive segments, wherein an electrically conductive segment is provided as the contact surface of a plurality of said tapered sides of said tapered elements of each of said members with an electrically conductive segment on one of said tapered sides of one member insulated from an electrically conductive segment of another of said tapered sides of the same member so that electrically conductive segments of said first member engage with electrically conductive segments of said second member when said first and second members are fastened together to provide a plurality of electrical connections, and the engagement between electrically conductive segments at each electrical connection also provides the only physical fastening that is needed in order to provide each electrical connection with a sufficient force to ensure such electrical connection.

2. A multiple conductor electrical connector as defined in claim 1 wherein said tapered side of some of said plurality of tapered elements is free from said electrically conductive segments.

3. A multiple conductor electrical connector as defined in claim 1 wherein at least some elements on one member are pyramidal projections and elements, and the elements on other member which contact said pyramidal projections when the two members intermesh are pyramidal depressions.

4. A multiple conductor electrical connector as defined in claim 1 wherein a polymeric layer of uniform thickness that is filled with laterally spaced, electrically conductive particles is adhered to and covers the structured surface of one of said members.

5. A multiple conductor electrical connector as defined in claim 1 wherein a plurality of said electrically conductive segments are on said one tapered side of each of a plurality of said elements and spaced from each other, and each conductive segment of one member contacts a conductive segment of the other member when the members intermesh.

6. A multiple conductor electrical connector as defined in claim 1 and further comprising an electrically conductive lead at each of said electrically conductive segments.

7. The multiple conductor electrical connector of claim 1, wherein the tangent of the half angle of said tapered sides is no greater than the coefficient of friction of the material of the contact surfaces thereof.

8. A multiple conductor electrical connector as defined in claim 1 wherein each element has a second side inclined relative to a common plane at an angle sufficient to form a tape that fits flush against a tapered side of an element of the other member when the members intermesh.

9. A multiple conductor electrical connector as defined in claim 8 wherein there is an electrically conductive segment covering only a portion of each of a plurality of said tapered sides.

10. A multiple conductor electrical connector as defined in claim 8 wherein at least one of said electrically conductive segments is on each of said first-mentioned tapered sides while each second tapered side is substantially free from said electrically conductive segments.

11. A multiple conductor electrical connector as defined in claim 1 wherein said elements form ridges and grooves, and the ridges of each member fit into the grooves of the other member when the members intermesh.

12. A multiple conductor electrical connector as defined in claim 11 wherein said ridges and grooves are annular.

13. A multiple conductor electrical connector as defined in claim 11 wherein said ridges and grooves are linear.

14. The multiple conductor electrical connector of claim 11, wherein at least one of said ridges is provided with a plurality of tapered sides and each of said plurality of tapered sides is provided with an electrically conductive segment that are insulated from one another.

15. A multiple conductor electrical connector as defined in claim 11 wherein said elements on one member form flutes, each having two tapered sides that fit flush against tapered sides of grooves on the other member when the two members intermesh.

16. A multiple conductor electrical connector as defined in claim 15 wherein the member becoming fluted is a printed circuit board, and the flutes are formed in both faces of the printed circuit board.

17. A multiple conductor electrical connector as defined in claim 1 wherein electrically conductive segments on one of said members are narrow.

18. A multiple conductor electrical connector as defined in claim 17 wherein electrically conductive segments on the other of said members that are connected by said narrow members are broad.

19. A multiple conductor electrical connector as defined in claim 17 wherein said narrow members comprise knives, and electrically conductive segments on the other of said members that are contacted by said knives are wires.

20. An electrical connector comprising: firs and second members, each having a connecting means provided on a major surface thereof for engagement with one another so as to physically fasten said first and second members together, said connecting means for each member comprising a structured surface including a plurality of tapered elements, said tapered elements each having a tapered side inclined relative to a common plane in each of said members so that when the connecting means of said members are engaged with one another said tapered elements of said first member intermesh with tapered elements of said second member while contact surfaces of said tapered sides of said tapered elements are engaged with one another without interlocking of said tapered elements, said first and second members each comprising an electrically insulative body and an electrically conductive segment, wherein an electrically conductive segment is provided as the contact surface of at least one of said tapered sides of said tapered elements of each of said members so that an electrically conductive segment of said first member engages with an electrically conductive segment of said second member when said first and second members are fastened together to provide an electrical connection, and the contact surfaces of at least one of said tapered sides of a tapered element of each member are free of electrically conductive segments.

21. A multiple conductor electrical connector comprising: first and second members, each having a connecting means for engagement with one another so as to physically fasten said first and second members together, said connecting means for each member comprising a tapered side inclined relative to a common plane in each of said members so that when the connecting means of said members are engaged with one another contact surfaces of said tapered sides are engaged with one another without interlocking of said tapered sides of said members, said first and second members each comprising an electrically insulative body and a plurality of electrically conductive segments, wherein a plurality of electrically conductive segments which are insulated from one another are provided as the contact surface of a tapered side of each of said members so that electrically conductive segments of said first member engage with electrically conductive segments of said second member when said first and second members are fastened together to provide a plurality of electrical connections, and the engagement between electrically conductive segments at each electrical connection also provides the only physical fastening that is needed in order to provide each electrical connection with sufficient force t ensure such electrical connection.

* * * * *

UNITED STATES PATENT AND TRADEMARK OFFICE
CERTIFICATE OF CORRECTION

PATENT NO. : 5,176,530

DATED : January 5, 1993

INVENTOR(S) : Reylek, et al

It is certified that error appears in the above-identified patent and that said Letters Patent is hereby corrected as shown below:

Col. 2, line 43, Replace "o" with --of--

Col. 4, line 53, Replace "FIG." with --FIGS.--

Col. 7, line 18, Replace "f" with --of--

Col. 9, line 41, Replace "85" with --185--

Col. 11, line 22, Intert --.-- after "holes"

Col. 11, line 49, Replace "as" with --was--

Col. 11, lines 50 & 51, Do not start a new paragraph with "These ..."

Col. 13, lines 25 & 26, Replace "define din" with --defined in--

Col. 14, line 46, Replace "t" with --to--

Signed and Sealed this

Twenty-third Day of November, 1993

*Attest:*

BRUCE LEHMAN

*Attesting Officer*  Commissioner of Patents and Trademarks